(12) United States Patent
Hayasaka et al.

(10) Patent No.: US 9,614,493 B2
(45) Date of Patent: Apr. 4, 2017

(54) QUARTZ CRYSTAL DEVICE AND METHOD FOR FABRICATING THE SAME

(71) Applicant: NIHON DEMPA KOGYO CO., LTD., Tokyo (JP)

(72) Inventors: Taichi Hayasaka, Saitama (JP); Shuichi Mizusawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 431 days.

(21) Appl. No.: 14/291,001

(22) Filed: May 30, 2014

(65) Prior Publication Data

US 2014/0361665 A1 Dec. 11, 2014

(30) Foreign Application Priority Data

Jun. 10, 2013 (JP) .................................. 2013-121401

(51) Int. Cl.
*H01L 41/047* (2006.01)
*H03H 9/10* (2006.01)

(52) U.S. Cl.
CPC ......... *H03H 9/1021* (2013.01); *H01L 41/047* (2013.01); *H01L 2224/16225* (2013.01); *H01L 2224/97* (2013.01)

(58) Field of Classification Search
CPC .. H01L 41/047; H01L 41/0477; H03H 9/1021
USPC ................................. 310/348, 364, 368, 370
See application file for complete search history.

(56) References Cited

U.S. PATENT DOCUMENTS

| 5,554,211 | A | 9/1996 | Bokisa et al. |
| 2012/0200198 | A1 | 8/2012 | Yamamoto |
| 2012/0256695 | A1 | 10/2012 | Kuroda |
| 2014/0346930 | A1* | 11/2014 | Kohda ................ H01L 41/0533 310/344 |

FOREIGN PATENT DOCUMENTS

| JP | 2000-252375 | 9/2000 |
| JP | 2012-044105 | 3/2012 |
| TW | 322516 | 12/1997 |

OTHER PUBLICATIONS

"Office Action of Taiwan Counterpart Application", issued on Aug. 5, 2016, p. 1-4, in which the listed references were cited.

* cited by examiner

*Primary Examiner* — Derek Rosenau
(74) *Attorney, Agent, or Firm* — Jianq Chyun IP Office

(57) ABSTRACT

A surface mount type quartz crystal device includes a quartz crystal vibrating piece and a base plate. The quartz crystal vibrating piece is configured to vibrate at a predetermined frequency. The base plate is made of a crystal or a glass. The base plate includes an external electrode disposed on a bottom surface of the base plate to mount the quartz crystal device. The quartz crystal vibrating piece is placed on an opposite surface of the bottom face. The external electrode includes a metal film formed on a surface of the base plate by sputtering, and an electroless plating film formed on a surface of the metal film by electroless plating. The electroless plating film includes a nickel layer including lead and bismuth.

8 Claims, 15 Drawing Sheets

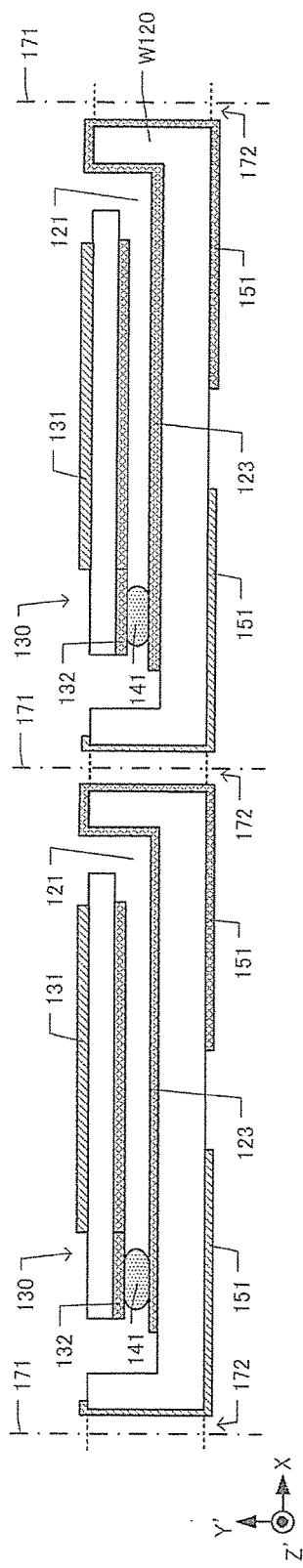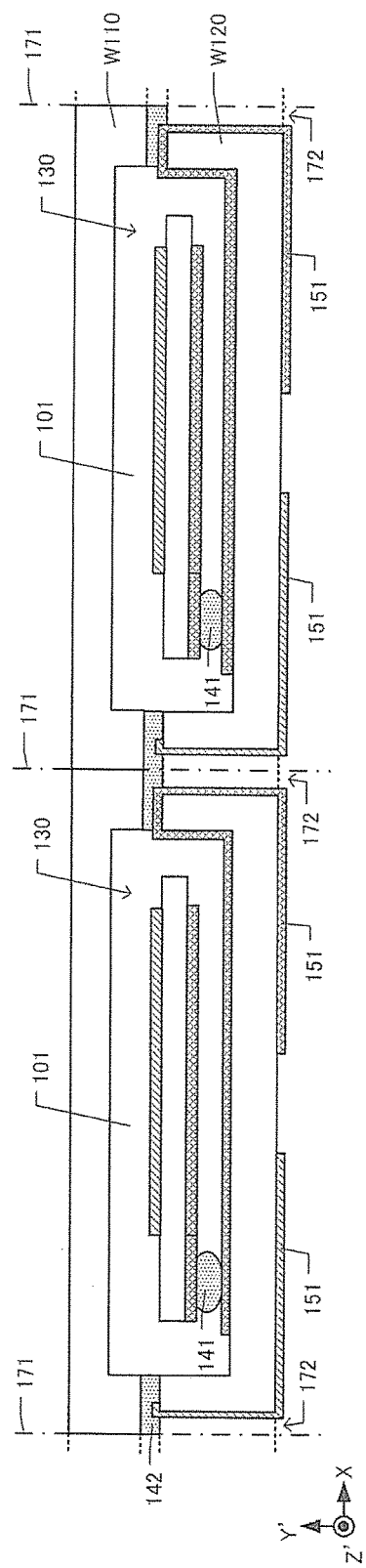
FIG. 6A
FIG. 6B

QUARTZ CRYSTAL DEVICE AND METHOD FOR FABRICATING THE SAME

CROSS REFERENCE TO RELATED APPLICATION

This application claims the priority benefit of Japan application serial no. 2013-121401, filed on Jun. 10, 2013. The entirety of the above-mentioned patent application is hereby incorporated by reference herein and made a part of this specification.

TECHNICAL FIELD

This disclosure relates to a quartz crystal device whose external electrode is formed by electroless plating, and a method for fabricating the quartz crystal device.

DESCRIPTION OF THE RELATED ART

A known surface mount type quartz crystal device includes a quartz crystal vibrating piece that vibrates at a predetermined frequency. The quartz crystal device includes an external electrode disposed on the bottom surface, and this external electrode is bonded to a printed circuit via a solder. Accordingly the quartz crystal device is bonded to the printed circuit. However, the external electrode directly touches the solder heated for bonding, which causes heat transfer from the heated solder to the external electrode. This sometimes peels off the external electrode or damages the external electrode. In addition, the external electrode is sometimes absorbed by the solder, and changes its composition, which damages the external electrode.

In order to solve the above-described problem, for example, Japanese Unexamined Patent Application Publication No. 2000-252375 (hereinafter referred to as Patent Literature 1) discloses a technique for forming an external electrode of a chip type electronic component, which includes a thick film such as a nickel plating layer. Also Patent Literature 1 describes that the technique reduces the damage of the external electrode by forming the external electrode as a thick film. While, Japanese Unexamined Patent Application Publication No. 2012-44105 (hereinafter referred to as Patent Literature 2) discloses a technique for forming an external electrode of a quartz crystal device by electroless plating.

However, the external electrodes having a nickel plating layer illustrated in Patent Literature 1 and Patent Literature 2 have some shortcomings. First, a typical plating layer formed by electroless plating disadvantageously includes a lead (Pb). The RoHS directive, which is a directive adopted by the European Union (EU), restricts usage of a lead, then the lead content in the external electrode should be equal to or less than 1000 ppm. Second, although the quartz crystal devices should meet criteria of drop-resistance and bend-resistance, it is unfortunately difficult to meet such criteria if an external electrode is formed with using small amount of a lead.

A need thus exists for a quartz crystal device and a method for fabricating the quartz crystal device which are not susceptible to the drawback mentioned above.

SUMMARY

A surface mount type quartz crystal device according to a first aspect of the disclosure includes a quartz crystal vibrating piece and a base plate. The quartz crystal vibrating piece is configured to vibrate at a predetermined frequency. The base plate is made of a crystal or a glass. The base plate includes an external electrode disposed on a bottom surface of the base plate to mount the quartz crystal device. The quartz crystal vibrating piece is placed on an opposite surface of the bottom face. The external electrode includes a metal film formed on a surface of the base plate by sputtering, and an electroless plating film formed on a surface of the metal film by electroless plating. The electroless plating film includes a nickel layer including lead and bismuth.

BRIEF DESCRIPTION OF THE DRAWINGS

The foregoing and additional features and characteristics of this disclosure will become more apparent from the following detailed description considered with reference to the accompanying drawings.

FIG. 6A is a partial cross-sectional view of a base wafer W120 with a quartz crystal vibrating piece 130 placed on the base wafer W120.

FIG. 6B is a partial cross-sectional view of the lid wafer W110, the quartz crystal vibrating piece 130, and the base wafer W120.

DETAILED DESCRIPTION

The following describes the preferred embodiment of this disclosure with reference to the drawings. It will be understood that the scope of the disclosure is not limited to the described embodiments, unless otherwise stated.

Configuration of Quartz Crystal Device 100 According to First Embodiment

Figure 1:
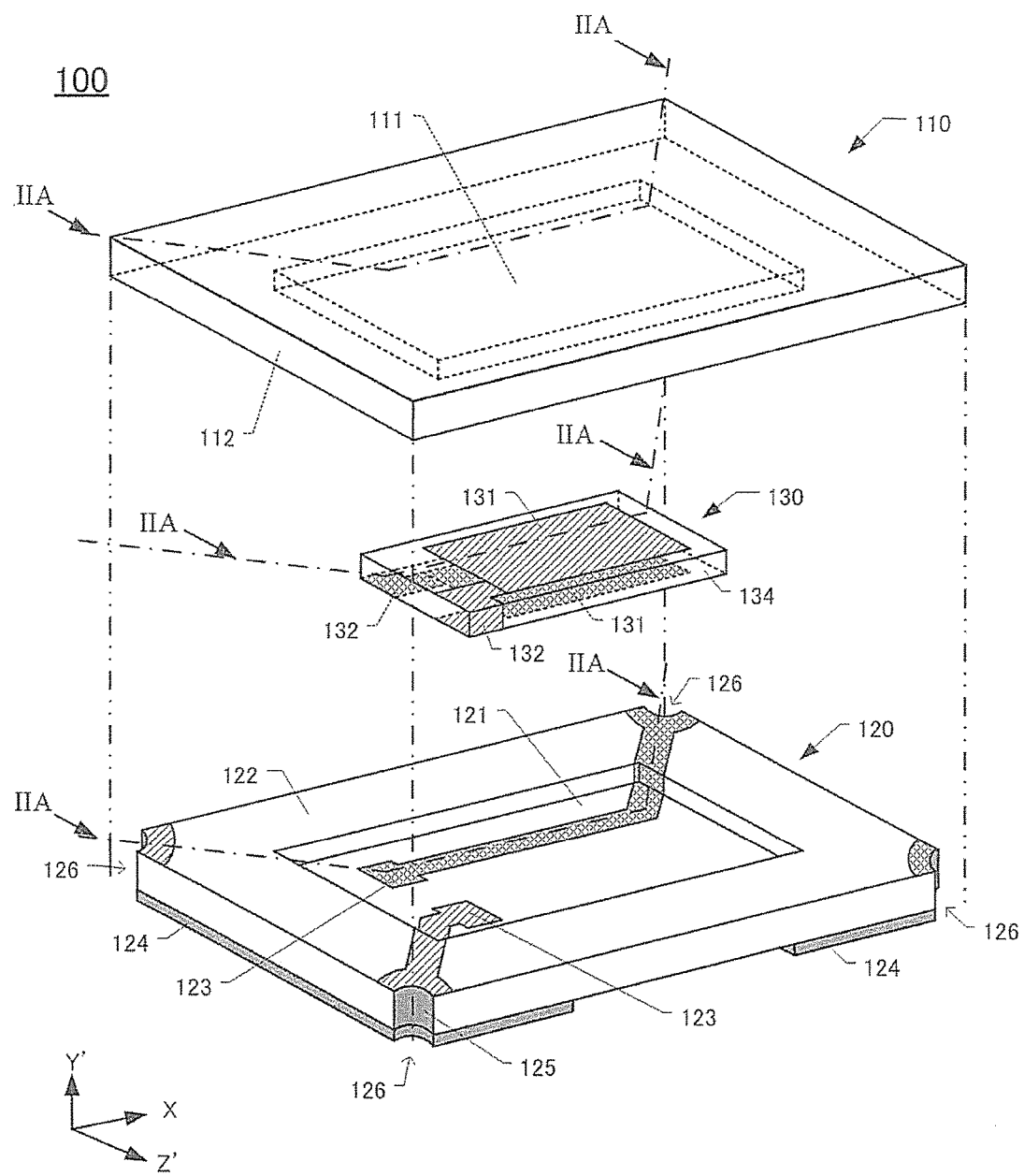
FIG. 1 is an exploded perspective view of a quartz crystal device 100.

FIG. 1 is an exploded perspective view of a quartz crystal device 100. The quartz crystal device 100 includes a lid plate 110, a base plate 120, and a quartz crystal vibrating piece 130. For example, an AT-cut quartz-crystal vibrating piece is used as the quartz crystal vibrating piece 130. The AT-cut quartz-crystal vibrating piece has a principal surface (Y-Z plane) that is tilted by 35° 15' about the Y-axis of crystallographic axes (XYZ) in the direction from the Z-axis to the Y-axis around the X-axis. In the following description, the Y'-axis and the Z'-axis indicate new axes tilted with reference to the axis directions of the AT-cut quartz-crystal vibrating piece. In other words, in the quartz crystal device 100, this disclosure defines the long side direction of the quartz crystal device 100 as the X-axis direction, the height direction of the quartz crystal device 100 as the Y'-axis direction, and the direction perpendicular to the X and Y'-axis directions as the Z'-axis direction.

The quartz crystal vibrating piece 130 includes a vibrating portion 134, excitation electrodes 131, and extraction electrodes 132. The vibrating portion 134 vibrates at a predetermined vibration frequency and has a rectangular shape. One of the excitation electrodes 131 is disposed on a surface at the +Y'-axis side of the vibrating portion 134 and the other one of excitation electrodes 131 is disposed on a surface at the −Y'-axis side of the vibrating portion 134. The extraction electrodes 132 are extracted from of the respective excitation electrodes 131 to the −X-axis side of the vibrating portion 134. One of the extraction electrodes 132 is extracted from the excitation electrode 131 disposed on the surface at the +Y'-axis side of the vibrating portion 134 to the −X-axis side and the +Z'-axis side of the vibrating portion 134, and further extends to the surface at the −Y'-axis side of the vibrating portion 134 via the side surface at the +Z'-axis side of the vibrating portion 134. The other one of the extraction electrodes 132 is extracted from the excitation electrode 131 disposed on the surface at the −Y'-axis side of the vibrating portion 134, and extends to a corner at the −X-axis side and the −Z'-axis side of the vibrating portion 134.

The base plate 120 is made of a crystal or a glass as a base material, and includes electrodes disposed on the surface of the base plate 120. The base plate 120 includes a bonding surface 122 disposed at a peripheral area of the surface at the +Y'-axis side of the base plate 120. The bonding surface 122 is to be bonded to the lid plate 110 via a sealing material 142 (see FIG. 2A). The base plate 120 also includes a depressed portion 121 at the center of the surface at the +Y'-axis side, and the depressed portion 121 is depressed from the bonding surface 122 in the −Y'-axis direction. The depressed portion 121 includes a pair of connecting electrodes 123, and each of the connecting electrodes 123 is electrically connected to the extraction electrode 132 of the quartz crystal vibrating piece 130 via a conductive adhesive 141 (see FIG. 2A). The base plate 120 includes external electrodes 124 on the bottom surface, which is the surface at the −Y'-axis side. The external electrodes 124 are to be used to connect the quartz crystal device 100 to a printed circuit board or similar member. In addition, the base plate 120 includes castellations 126 disposed at four corners on the side surfaces of the base plate 120. The castellation 126 is depressed inside of the base plate 120. Each of the castellations 126 includes a side surface electrode 125 on its side surface. Each of the external electrodes 124 is electrically connected to the connecting electrodes 123 via the side surface electrode 125.

The lid plate 110 includes a depressed portion 111 disposed on the surface at the −Y'-axis side. The depressed portion 111 is depressed in the +Y'-axis direction. Also the lid plate 110 includes a bonding surface 112 disposed around the depressed portion 111. The bonding surface 112 is bonded to the bonding surface 122 of the base plate 120 via the sealing material 142 (see FIG. 2A).

Figure 2A:
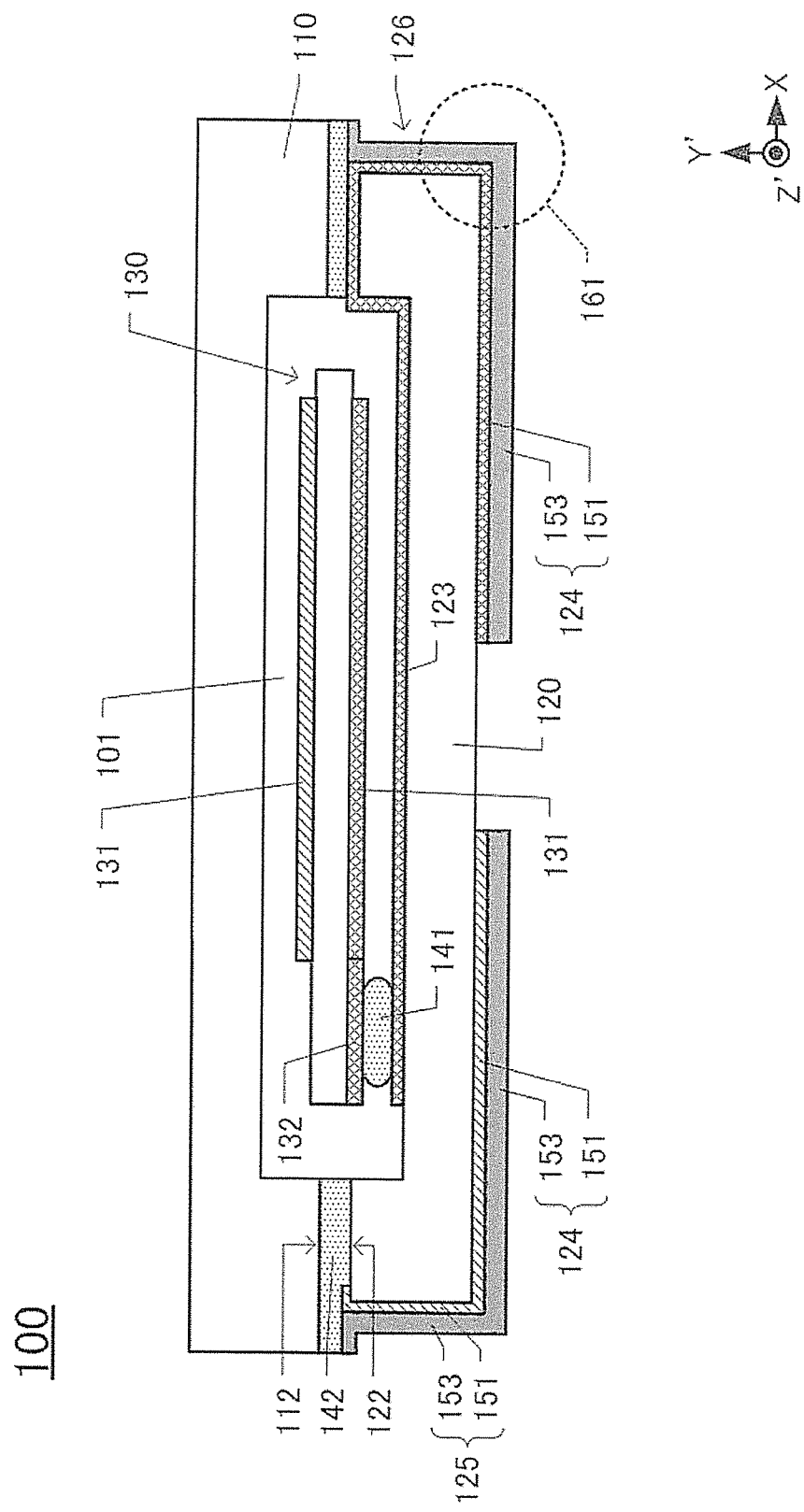
FIG. 2A is a cross-sectional view taken along the line IIA-IIA in FIG. 1.

FIG. 2A is a cross-sectional view taken along the line IIA-IIA in FIG. 1. The bonding surface 122 of the base plate 120 is bonded to the bonding surface 112 of the lid plate 110 via the sealing material 142, which forms a sealed cavity 101 in the quartz crystal device 100. The quartz crystal vibrating piece 130 is disposed in the cavity 101, and the extraction electrodes 132 are electrically connected to the connecting electrodes 123 of the base plate 120 via the conductive adhesives 141. This electrically connects the excitation electrodes 131 to the external electrodes 124. The external electrode 124 includes a first metal film 151 and an electroless plating film 153. The first metal film 151 is disposed on the surface at the −Y'-axis side of the base material of the base plate 120, and the electroless plating film 153 is disposed on the surface of the first metal film 151.

Figure 2B:
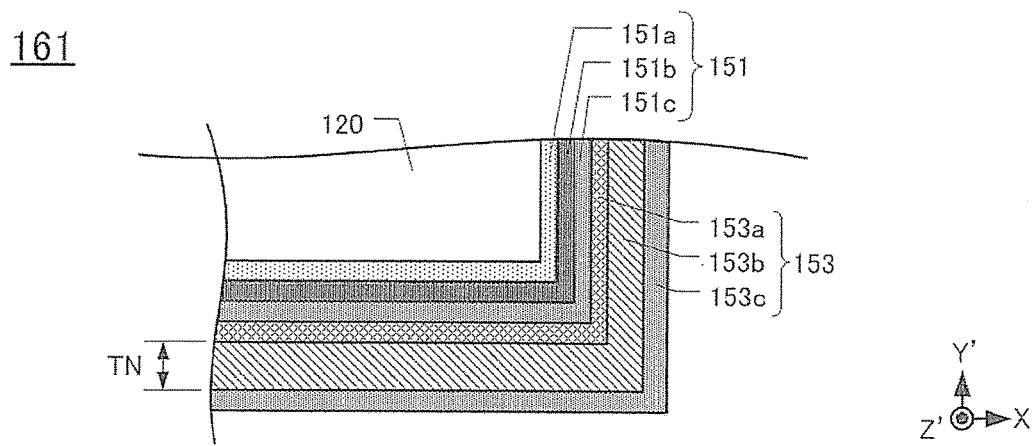
FIG. 2B is an enlarged view of a portion enclosed by a dotted line 161 of FIG. 2A.

FIG. 2B is an enlarged view of a portion enclosed by a dotted line 161 of FIG. 2A. FIG. 2B illustrates an enlarged cross-sectional view of the external electrode 124. The first metal film 151 is formed of three layers including a first layer 151a, a second layer 151b, and a third layer 151c. The first layer 151a is disposed on the surface of the base material of the base plate 120, and is made of a chrome (Cr). The chrome (Cr) is used as a material of the first layer 151a for a good adhesion to a material such as a crystal and a glass, which are the base material of the base plate 120. In addition, the third layer 151c disposed on the surface of the first metal film 151 is made of a gold (Au). A chrome (Cr) adheres to a material such as a crystal and a glass well, but does not stick to a solder or similar material, accordingly the surface of the first metal film 151 is covered with a gold (Au) that sticks to a solder well. Furthermore, the first metal film 151 includes the second layer 151b disposed between the first layer 151a and the third layer 151c. A chrome (Cr), which constitutes the first layer 151a, is dispersed into other layers, when being heated during the fabrication process. This reduces adhesion between a chrome (Cr) and the base plate 120. In addition, when a chrome (Cr) is dispersed into the surface of the first metal film 151, the chrome (Cr) oxidizes, which makes it difficult to form the electroless plating film 153 or similar film. In order to prevent dispersion of a chrome (Cr), the second layer 151b is disposed to prevent a chrome (Cr) from being dispersed into the gold (Au) layer.

The second layer 151b is made of, for example, a nickel-tungsten (Ni—W). Also, the second layer 151b may be made of a platinum (Pt) or similar metal. An electrode including the electroless plating film 153 is peeled off more easily than an electrode not including the electroless plating film 153, due to distortion of the base plate 120 caused by a stress generated by the electroless plating film 153. The first metal film 151 prevents dispersion of a chrome (Cr) by disposing the second layer 151b, resulting in strong adhesion between the first metal film 151 and the base material of the base plate 120. This prevents the first metal film 151 from being peeled off easily.

The electroless plating film 153 includes a first layer 153a, a second layer 153b, and a third layer 153c. The first layer 153a is disposed on the surface of the first metal film 151, and the second layer 153b is disposed on the surface of the first layer 153a, and the third layer 153c is disposed on the surface of the second layer 153b. The first layer 153a is made of a palladium (Pd). The second layer 153b is made of a nickel (Ni), and the third layer 153c is made of a gold (Au). The second layer 153b, which is made of a nickel, has the largest thickness among the layers of the external electrode 124. A thickness TN of the second layer 153b is, for example, about 1 µm.

Method for Fabricating Quartz Crystal Device 100

Figure 3:
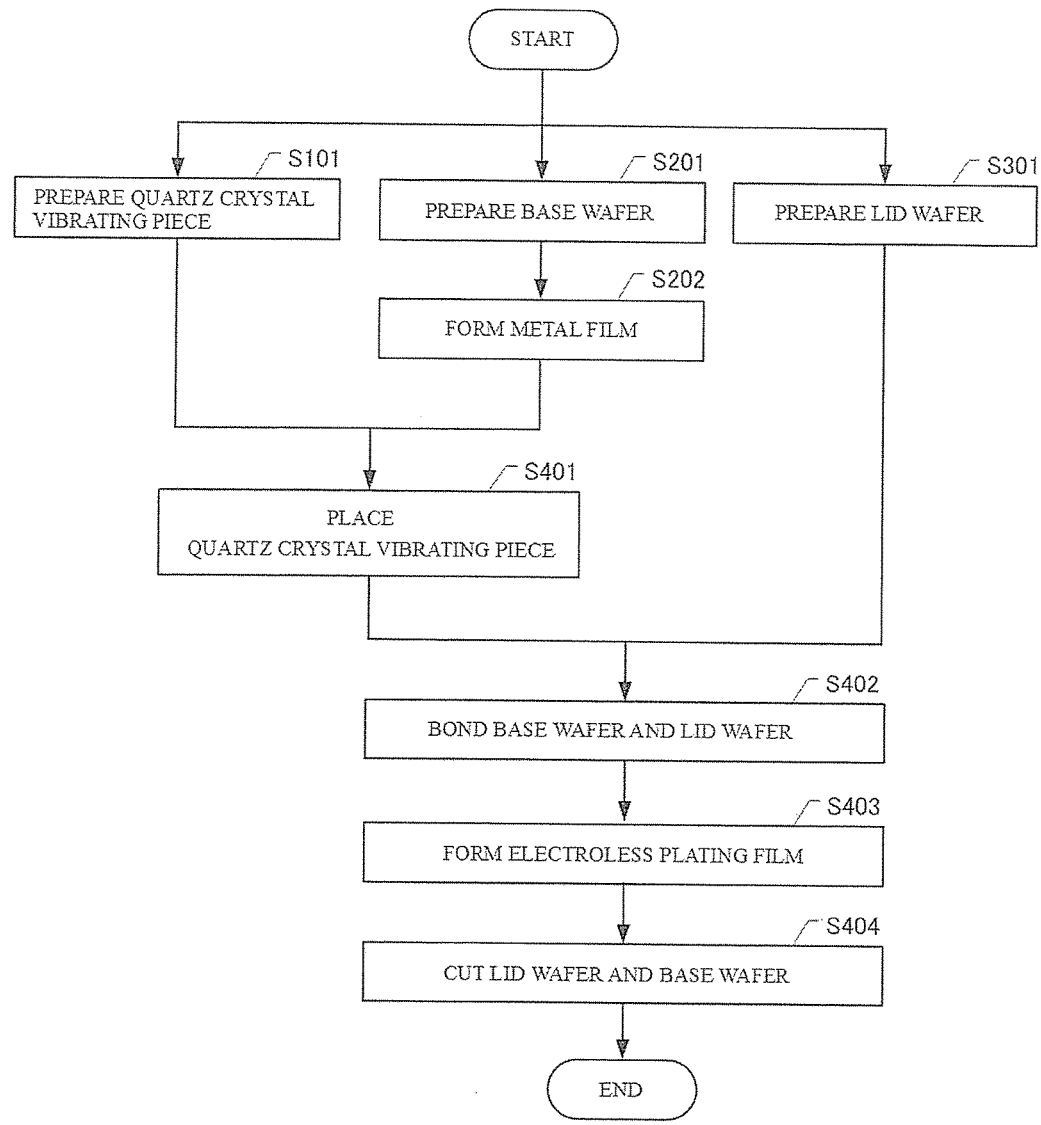
FIG. 3 is a flowchart illustrating a method for fabricating the quartz crystal device 100.

FIG. 3 is a flowchart illustrating a method for fabricating the quartz crystal device 100. The following describes the method for fabricating the quartz crystal device 100 with reference to FIG. 3.

In a step S101, a plurality of quartz crystal vibrating pieces 130 are prepared. In the step S101, first, a plurality of outside shapes of the quartz crystal vibrating pieces 130 is formed on a quartz-crystal wafer (not shown) made of a crystal by etching or similar technique. Then, the excitation electrode 131 and the extraction electrode 132 are formed on each quartz crystal vibrating piece 130 by a technique such as sputtering or vacuum evaporation. Each quartz crystal vibrating pieces 130 formed on the quartz-crystal wafer is folded or cut to be separated from the quartz-crystal wafer, accordingly the plurality of quartz crystal vibrating pieces 130 are prepared.

In a step S201, a base wafer W120 is prepared. A plurality of base plates 120 is formed on the base wafer W120. The base wafer W120 is made of a crystal or a glass as a base material. Depressed portions 121 and through-holes 172 (see FIG. 4A) are formed on the base wafer W120. The through-hole 172 is a portion to be the castellation 126 after the base wafer W120 is diced.

In a step S202, the first metal film 151 is formed on the base wafer W120. The step S202 is a process for forming a metal film. As illustrated in FIG. 2B, the first metal film 151 formed on the base wafer W120 includes the first layer 151a made of a chrome (Cr), the second layer 151b made of a nickel-tungsten (Ni—W), and the third layer 151c made of a gold (Au). These layers are formed by sputtering or vacuum evaporation. In the step S202, the first metal film 151 is formed, accordingly the connecting electrode 123, a part of the side surface electrode 125, and a part of the external electrode 124 are formed on each of the base plates 120.

Figure 4A:
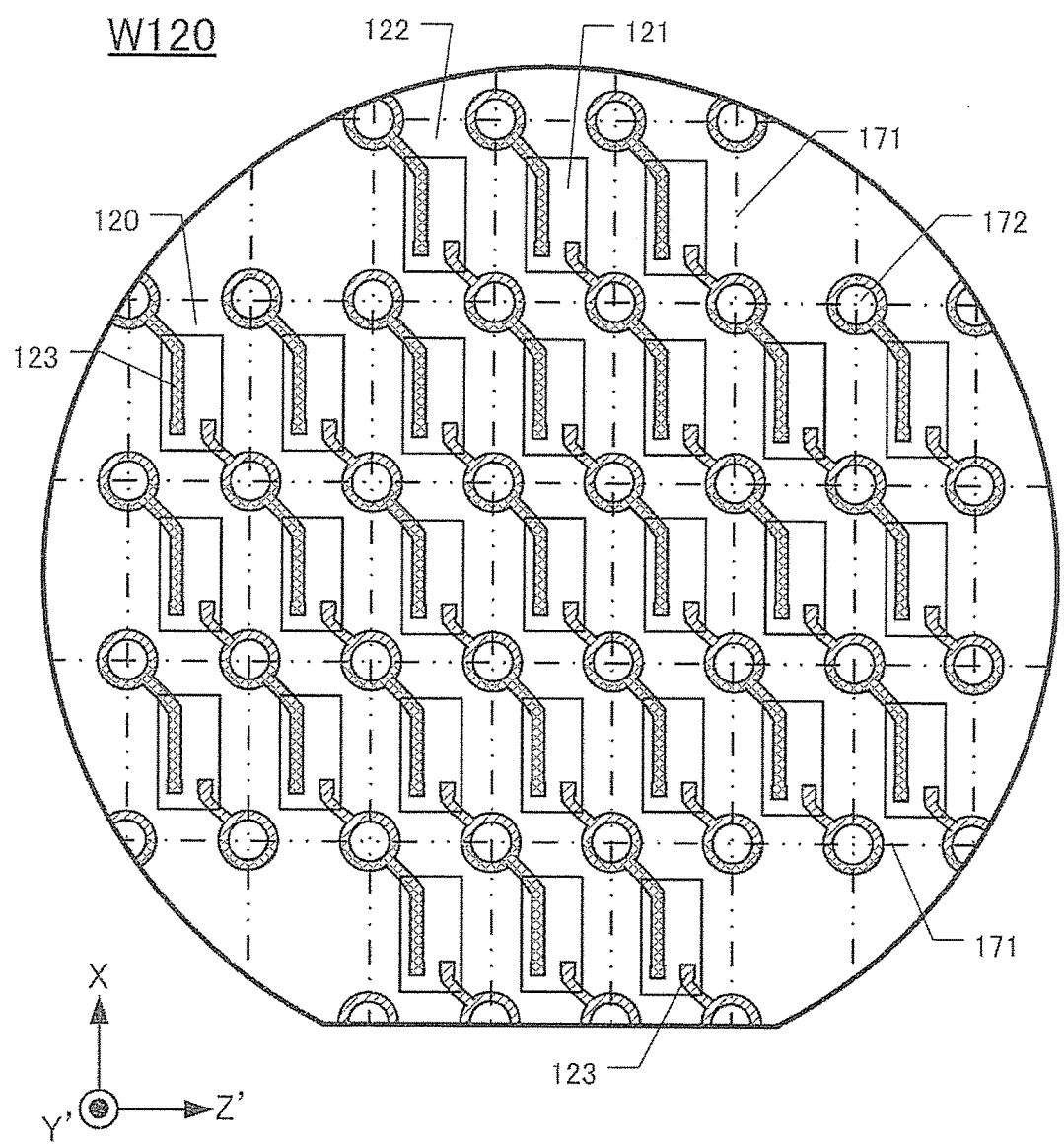
FIG. 4A is a plan view of a surface at the +Y'-axis side of a base wafer W120.

FIG. 4A is a plan view of a surface at the +Y'-axis side of the base wafer W120. A plurality of base plates 120 is formed on the base wafer W120 illustrated in FIG. 4A, and each of the base plates 120 is aligned in the X-axis direction and in the Z'-axis direction. Also, FIG. 4A illustrates scribe lines 171 along boundaries between the base plates 120 adjacent to one another. The scribe lines 171 are lines indicating positions at which the wafer is diced in a step S404 that will be described below. The through-holes 172 are formed at intersections of the scribe lines 171 extending in the X-axis direction and the scribe lines 171 extending in the Z'-axis direction. The through-hole 172 passes through the base wafer W120 in the Y'-axis direction. The through-hole 172 is a portions to be the castellations 126 after the wafer is diced in the step S404 that will be described below. In addition, the depressed portion 121 is formed on the surface at the +Y'-axis side of each of the base plates 120, and the connecting electrode 123 is formed on the surface at the +Y'-axis side of each of the base plates 120.

Figure 4B:
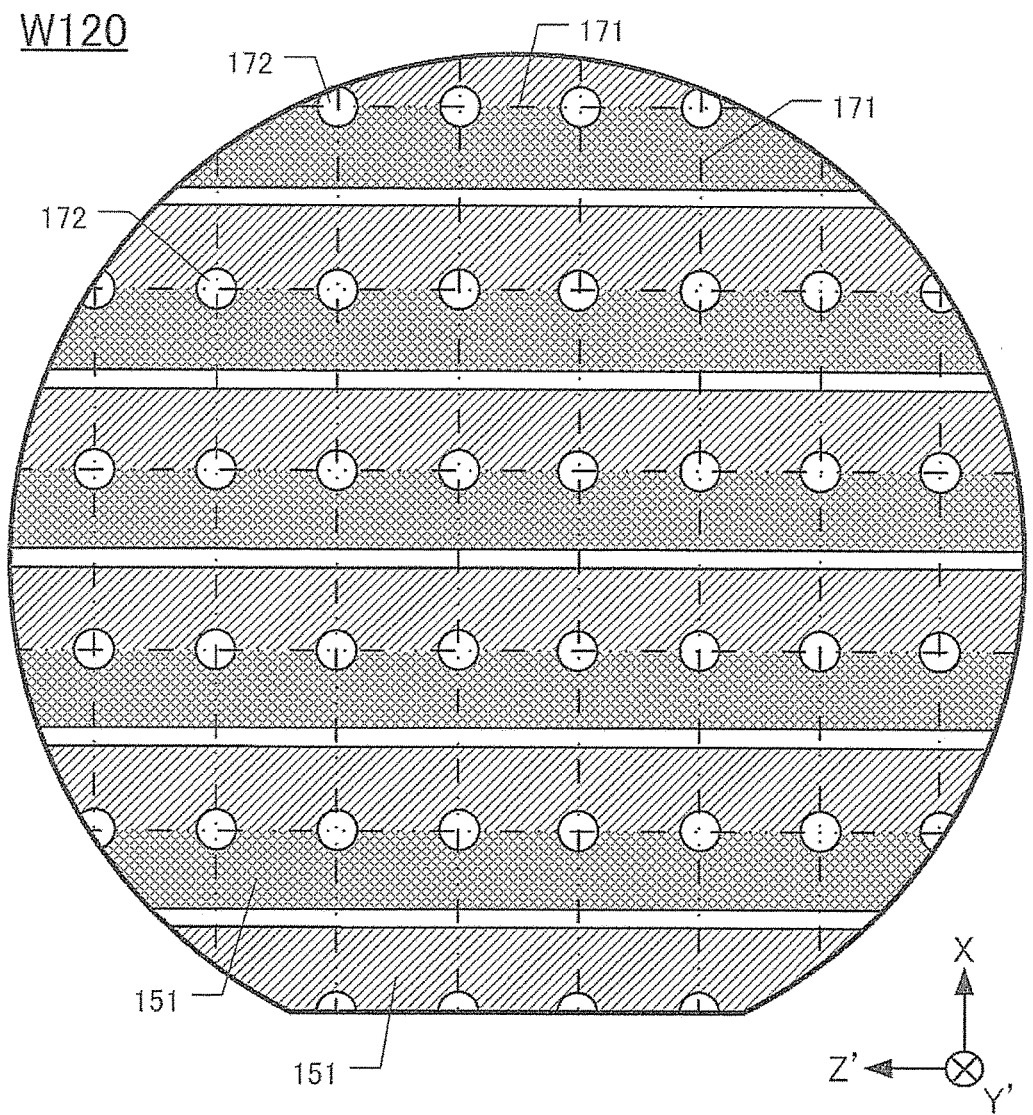
FIG. 4B is a plan view of a surface at the −Y'-axis side of the base wafer W120.

FIG. 4B is a plan view of a surface at the −Y'-axis side of the base wafer W120. The first metal films 151 are formed on the surface at the −Y'-axis side of the base wafer W120. The first metal film 151 will become a part of an external electrode 124. The first metal film 151 is formed to extend in the Z'-axis direction of the base wafer W120. Also, the first metal film 151 is formed in the through-hole 172. The first metal film 151 is electrically connected to the connecting electrode 123 via the side surface electrode 125 formed in the through-hole 172.

Returning to FIG. 3, in a step S301, a lid wafer W110 is prepared. A plurality of lid plates 110 is formed on the lid wafer W110. The depressed portion 111 is formed on the surface at the −Y'-axis side of each of the lid plates 110.

Figure 5:
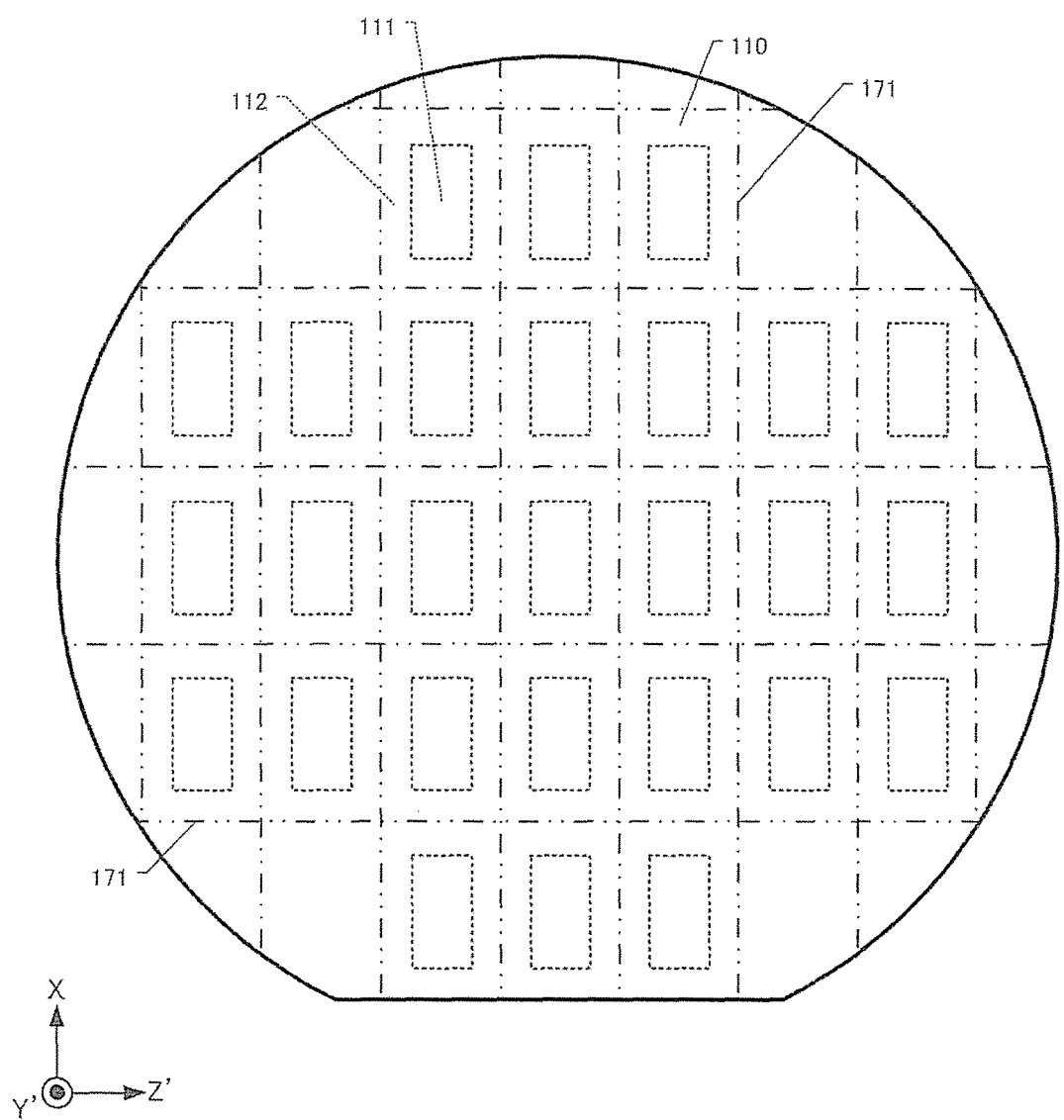
FIG. 5 is a plan view of a surface at the +Y'-axis side of a lid wafer W110.

FIG. 5 is a plan view of a surface at the +Y'-axis side of the lid wafer W110. A plurality of lid plates 110 is formed on the lid wafer W110, and each of the lid plates 110 is aligned in the X-axis direction and in the Z'-axis direction. The depressed portion 111 and the bonding surface 112 are formed on the surface at the −Y'-axis side of each of the lid plates 110. In FIG. 5, two-dot chain lines indicate boundaries between lid plates 110 adjacent to one another, and this two-dot chain line will become the scribe line 171.

In a step S401, the quartz crystal vibrating pieces 130 are placed on the base wafer W120. The step S401 is a process for placing. The quartz crystal vibrating piece 130 is placed on each of the depressed portions 121 of the base wafer W120 via the conductive adhesive 141.

FIG. 6A is a partial cross-sectional view of the base wafer W120 with the quartz crystal vibrating piece 130 placed on the base wafer W120. FIG. 6A illustrates a cross-sectional view corresponding to the IIA-IIA cross section of FIG. 1. The extraction electrode 132 is electrically connected to the connecting electrode 123 via the conductive adhesive 141. Accordingly, the quartz crystal vibrating piece 130 is placed on the depressed portion 121 of the base wafer W120. Also, this electrically connects the excitation electrode 131 to the first metal film 151 formed on the surface at the −Y'-axis side of the base wafer W120.

In a step S402, the base wafer W120 is bonded to the lid wafer W110. The step S402 is a process for bonding. The base wafer W120 is bonded to the lid wafer W110 as follows. The sealing material 142 is applied on the bonding surface 122 of the base wafer W120 or the bonding surface 112 of the lid wafer W110. Then the bonding surface 122 of the base wafer W120 and the bonding surface 112 of the lid wafer W110 face one another and are bonded to sandwich the sealing material 142.

FIG. 6B is a partial cross-sectional view of the lid wafer W110, the quartz crystal vibrating piece 130, and the base wafer W120. FIG. 6B illustrates a cross-sectional view including a cross section similar to FIG. 6A. The lid wafer W110 is bonded to the base wafer W120 via the sealing material 142, which forms the sealed cavity 101. The quartz crystal vibrating piece 130 is placed in the cavity 101.

In a step S403, the electroless plating film 153 is formed. The step S403 is a process for electroless plating. In the step S403, plating an electroless on the surface of the first metal film 151 formed on the surface at the −Y'-axis side of the base wafer W120 forms the electroless plating film 153 on the surface at the −Y'-axis side of the lid wafer W110, on the surface at the −Y'-axis side of the base wafer W120, and on the side surface of through-hole 172.

Figure 6C:
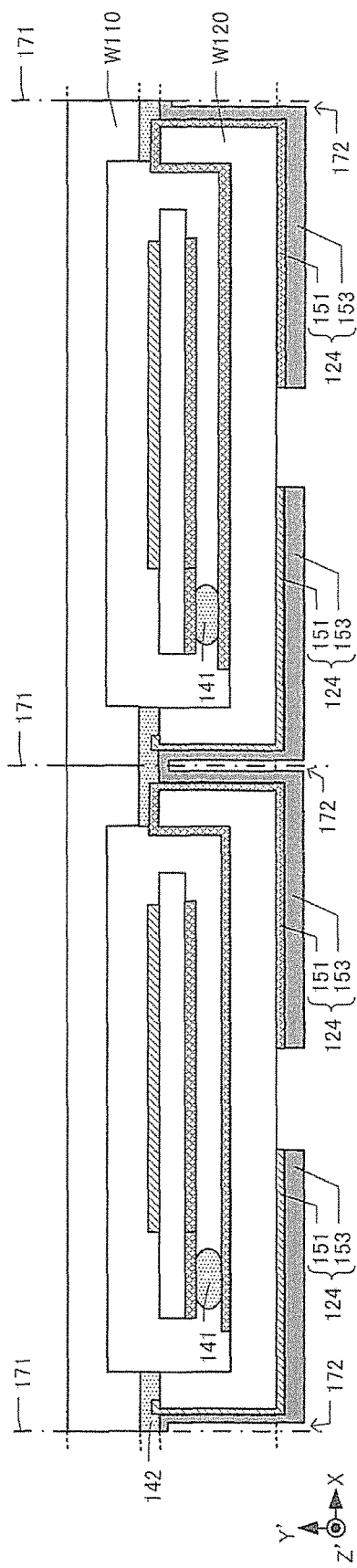
FIG. 6C is a partial cross-sectional view of the lid wafer W110, the quartz crystal vibrating piece 130, and the base wafer W120 with an electroless plating film 153 disposed on the base wafer W120.

FIG. 6C is a partial cross-sectional view of the lid wafer W110, the quartz crystal vibrating piece 130, and the base wafer W120 with the electroless plating film 153 on the base wafer W120. FIG. 6C illustrates a cross section similar to FIG. 6B. The electroless plating film 153 is formed as follows as illustrated in FIG. 2B. The first layer 153a is formed by electroless plating with a palladium (Pd), the second layer 153b is formed on the surface of the first layer 153a by electroless plating with a nickel (Ni), the third layer 153c is formed on the surface of the second layer 153b by electroless plating with a gold (Au).

In a step S404, the lid wafer W110 and the base wafer W120 are cut. The lid wafer W110 and the base wafer W120 are cut along the scribe lines 171 by a technique such as dicing.

Evaluation of Electroless Plating Film Formed by Electroless Plating

In the European Union (EU), the RoHS directive, which is a directive adopted by the European Union (EU), defines the lead content in the external electrode of a quartz crystal device to be equal to or less than 1000 ppm. Electroless plating on a quartz crystal device is performed by impregnating a base wafer with a plating liquid to which a stabilizer is added for stabilizing the plating liquid. A commercially available stabilizer includes a lead (Pb) or a bismuth (Bi) or similar component. When a lead is used as a stabilizer, the lead is included in an electroless plating film, then the lead is detected from an external electrode. With conventional electroless plating techniques, the amount of lead contained in an external electrode disadvantageously exceeds 1000 ppm. This causes a problem.

Figure 7A:
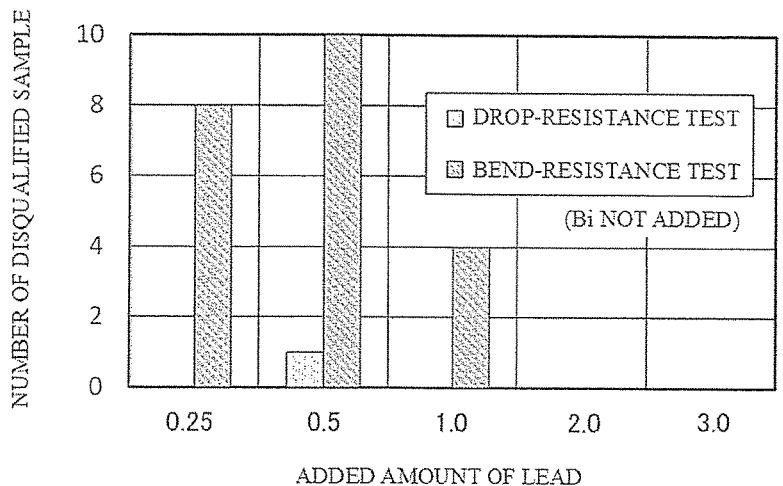
FIG. 7A is a graph illustrating a relationship between the amount of a lead (Pb) added as a stabilizer and the number of disqualified sample in a drop-resistance test and a bend-resistance test.
Figure 7B:
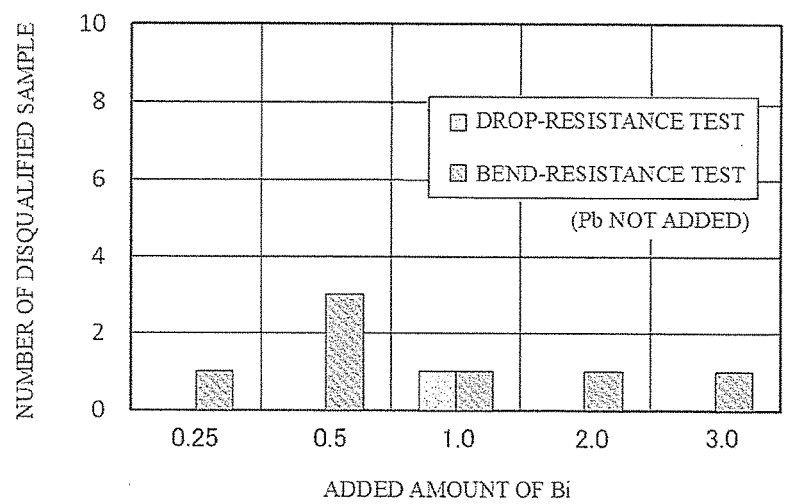
FIG. 7B is a graph illustrating a relationship between the amount of a bismuth (Bi) added as a stabilizer and the number of disqualified sample in a drop-resistance test and a bend-resistance test.
Figure 7C:
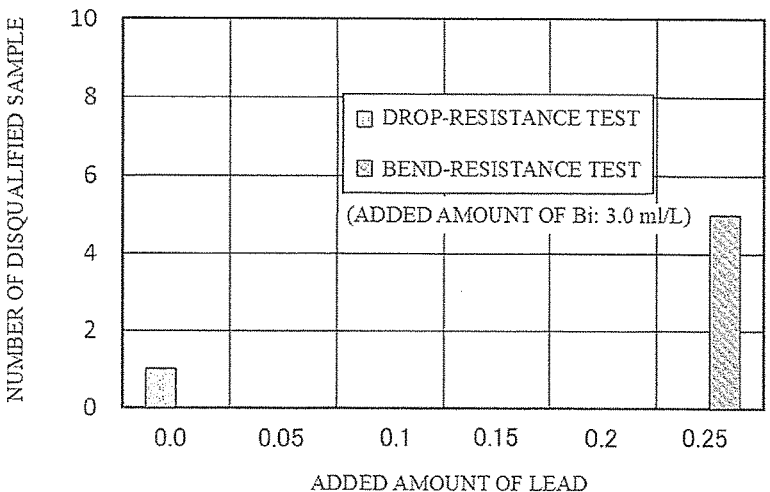
FIG. 7C is a graph illustrating a relationship between the amount of the lead (Pb) further added as a stabilizer, with the bismuth (Bi) already being added as a stabilizer, and the number of disqualified sample in a drop-resistance test and a bend-resistance test.

On the other hand, a quartz crystal device is required to have no peeling at the external electrode even if the quartz crystal device drops. In addition, when the external electrode is formed in thick, a stress caused by, for example, contraction of the external electrode is applied to the quartz crystal device, which sometimes easily generates a crack or similar defect in the quartz crystal device. However, the quartz crystal device is required to have no crack or similar defect, even if a bending stress is applied to the quartz crystal device. Namely, the quartz crystal device is required to reduce the lead content in the external electrode, while meeting criteria for a drop-resistance and a bend-resistance. FIGS. 7A through 7C below illustrate results of a drop-resistance test and a bend-resistance test of the quartz crystal device, which are performed with changing the addition amount of a lead or a bismuth as a stabilizer. Here, the drop-resistance test is performed as follows. The quartz crystal device is dropped six times, each time is for one of six surfaces of the quartz crystal device. This is defined as one set and is continued for fifty sets. Finally it is confirmed whether or not the external electrodes of the quartz crystal device have a defect such as a peeling. Also, the bend-resistance test is performed as follows. An electrode having a configuration similar to an external electrode is formed on a crystal blank having a length of 90 mm. The crystal blank is bended by 3 mm, then it is confirmed whether or not the crystal blank have a crack. Also, the addition amount of a lead (Pb) or a bismuth (Bi) illustrated in the drawings indicates the amount of a lead (Pb) or a bismuth (Bi) that is added to a plating liquid when the second layer 153b is formed with a nickel.

FIG. 7A is a graph illustrating a relationship between the amount of a lead (Pb) added as a stabilizer and the number of disqualified sample in the drop-resistance test and the bend-resistance test. A stabilizer used in the tests in FIG. 7A includes a lead (Pb) but not a bismuth (Bi). Also, the drop-resistance test and the bend-resistance test are respectively carried out for ten samples. It is determined whether or not each sample has a peeling on the external electrode and a crack on the crystal blank. If it is confirmed that the external electrode has a peeling and a crack by the tests, that sample is determined to be disqualified. The horizontal axis in the graph indicates the addition amount of a lead (Pb) as a stabilizer. Each test is carried out at the addition amounts of a lead of 0.25 ml/L, 0.5 ml/L, 1.0 ml/L, 2.0 ml/L, and 3.0 ml/L. The vertical axis in the graph indicates the number of disqualified samples in each test.

When the addition amount of a lead (Pb) is 0.25 ml/L, eight samples out of ten samples are disqualified in the bend-resistance test. Also, ten disqualified samples are confirmed when the addition amount of a lead (Pb) is 0.5 ml/L, and four disqualified samples are confirmed when the addition amount of a lead (Pb) is 1.0 ml/L in the bend-resistance test. On the other hand, one disqualified sample is confirmed when the addition amount of a lead (Pb) is 0.5 ml/L in the drop-resistance test. No disqualified sample is confirmed when stabilizers are used with the addition amounts of a lead (Pb) of 2.0 ml/L and 3.0 ml/L.

As illustrated in FIG. 7A, since no disqualified sample is confirmed when a stabilizer is used with the addition amount of a lead (Pb) of 3.0 ml/L, the electroless plating is conventionally performed using a stabilizer with the addition amount of a lead (Pb) of 3.0 ml/L. However, Inductively Coupled Plasma (ICP) Atomic Emission Spectroscopy or Atomic Absorption Spectrometry detects the lead content of 6300 ppm, which exceeds 1000 ppm as the permissible value of the RoHS directive, from a nickel layer formed by electroless plating using a stabilizer with the addition amount of a lead (Pb) of 3.0 ml/L. Also, the calculation of the lead content in a nickel layer formed using a stabilizer with the addition amount of a lead (Pb) of 2.0 ml/L based on the above-described value indicates that the estimated lead content in the nickel layer is 4200 ppm, which exceeds the permissible value of the RoHS directive.

FIG. 7B is a graph illustrating a relationship between the amount of a bismuth (Bi) added as a stabilizer and the number of disqualified sample in a drop-resistance test and a bend-resistance test. A stabilizer used in the tests in FIG. 7B includes a bismuth (Bi) but not a lead (Pb). As illustrated in FIG. 7B, a disqualified sample is confirmed at every addition amount illustrated in FIG. 7B in the bend-resistance test. Also, in drop-resistance test, one sample is disqualified when the addition amount of a bismuth (Bi) is 1.0 ml/L.

In general, a bismuth is sometimes used as a stabilizer instead of a lead. However, it can be considered that the quartz crystal device is not allowed to use a stabilizer including a bismuth instead of a lead since the quartz crystal device cannot be qualified in the bend-resistance test when using a bismuth.

FIG. 7C is a graph illustrating a relationship between the amount of the lead (Pub) further added as a stabilizer, with the bismuth (Bi) already being added as a stabilizer, and the number of disqualified sample in a drop-resistance test and a bend-resistance test. A stabilizer used in the tests in FIG. 7C includes a bismuth (Bi) of 3.0 ml/L. In FIG. 7C, one sample is disqualified in the drop-resistance test when the lead (Pb) addition amount is 0.0 ml/L, and five samples are disqualified in the bend-resistance test when lead (Pb) addition amount is 0.25 ml/L.

Meanwhile, in FIG. 7C, no sample is disqualified in the drop-resistance test and the bend-resistance test when the lead (Pb) addition amount is a value in a range from 0.05 ml/L to 0.2 ml/L. Accordingly, it can be considered that the quartz crystal device can use a stabilizer with the bismuth (Bi) addition amount of 3.0 ml/L, and the lead (Pb) addition amount of a value in a range from 0.05 ml/L to 0.2 ml/L. Also in this case, the lead content in a nickel layer formed by electroless plating is estimated to 105 ppm when a lead (Pb) of 0.05 ml/L is added to a stabilize, and is estimated to 420 ppm when a lead (Pb) of 0.2 ml/L is added to a stabilizer. This calculation is based on the fact that a lead of 6300 ppm is detected when a lead (Pb) of 3.0 ml/L is added to a stabilizer. Also, the values may have about ten percent of errors in light of an analyzing error and errors between lots of samples or a similar error. Accordingly, the amount of a lead detected from the nickel layer is estimated to a value in a range from about 90 ppm to about 470 ppm when the lead (Pb) addition amount is a value in a range from 0.05 ml/L to 0.2 ml/L. The values in this range can be sufficiently included in the range regulated by the RoHS directive, in which the lead content in an external electrode is equal to or less than 1000 ppm.

In addition, regarding the addition amount of a bismuth (Bi), it is considered that a bismuth of about 6300 ppm may be detected from a nickel layer, taking a proportion between a lead (Pb) and a bismuth (Bi) into consideration. Thus, the amount of a bismuth detected from the nickel layer is estimated to a value in a range from about 5600 ppm to about 7000 ppm in light of about ten percent of errors.

As described above, when a stabilizer includes bismuth (Bi) of 3.0 ml/L and a lead (Pb) of a value in a range from 0.05 ml/L to 0.2 ml/L, the quartz crystal device can preferably withstand the drop-resistance test and the bend-resistance test. In addition, with the above-described range, the estimated lead amount detected from the nickel layer is preferably a value from about 90 ppm to about 470 ppm, which is sufficiently equal to or lower than 1000 ppm, which is the permissible value of the RoHS directive. Since the nickel layer formed by electroless plating covers equal to or more than ninety percent of the whole external electrode, it is considered that the lead content in the whole external electrode is sufficiently equal to or lower than 1000 ppm.

Second Embodiment

A quartz crystal device may include a quartz crystal vibrating piece having a framing portion surrounding a peripheral area of a vibrating portion of the quartz crystal vibrating piece. The following describes a quartz crystal device 200 including the quartz crystal vibrating piece including a framing portion. Note that, in the following description, the components same as those of the first embodiment are given same reference numerals, and a description of those is omitted.

Configuration of Quartz Crystal Device 200

Figure 8:
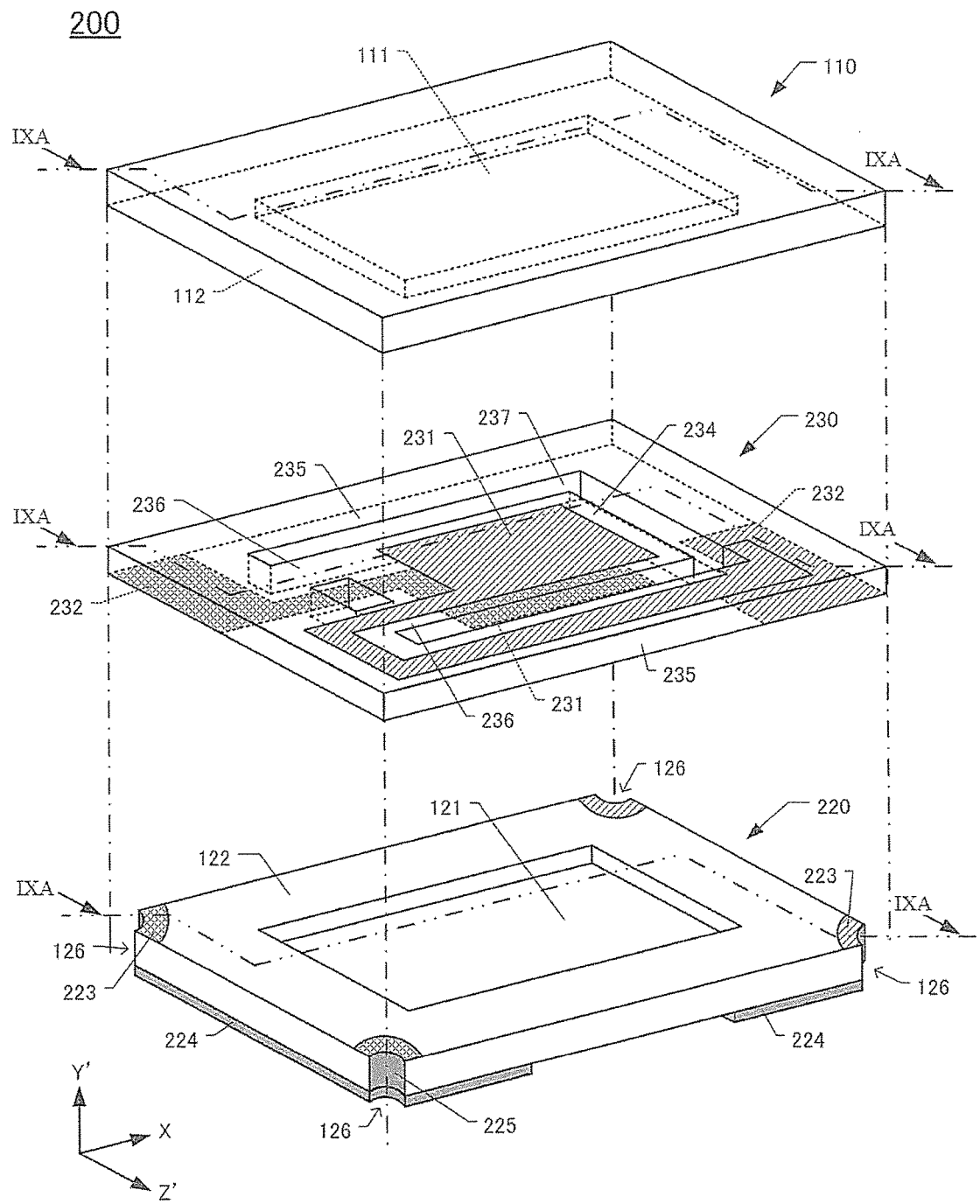
FIG. 8 is an exploded perspective view of a quartz crystal device 200.

FIG. 8 is an exploded perspective view of the quartz crystal device 200. The quartz crystal device 200 includes the lid plate 110, a base plate 220, and a quartz crystal vibrating piece 230. Similarly to the first embodiment, the quartz crystal device 200 includes an AT-cut quartz-crystal vibrating piece as the quartz crystal vibrating piece 230.

The quartz crystal vibrating piece 230 includes a vibrating portion 234, a framing portion 235, and connecting portions 236. The vibrating portion 234 vibrates at a predetermined frequency and has a rectangular shape. The framing portion 235 surrounds a peripheral area of the vibrating portion 234.

The connecting portions 236 connect the vibrating portion 234 and the framing portion 235. A through groove 237 passing through the quartz crystal vibrating piece 230 in the Y'-axis direction is disposed between the vibrating portion 234 and the framing portion 235, such that the vibrating portion 234 and the framing portion 235 have no direct contact with each other. The vibrating portion 234 and the framing portion 235 are connected to each other via the connecting portions 236 connected to the −X-axis side and the +Z'-axis side, and at the −X-axis side and the −Z'-axis side of the vibrating portion 234. Further, respective excitation electrodes 231 are disposed on the surface of the +Y'-axis side and on the surface of the −Y'-axis side of the vibrating portion 234, then respective extraction electrodes 232 are extracted from the respective excitation electrodes 231 to the framing portion 235. One of the extraction electrodes 232 is extracted from the excitation electrode 231 disposed on the surface at the +Y'-axis side of the vibrating portion 234 to the −X-axis side of the framing portion 235 via the connecting portion 236 at the +Z'-axis side, and further extends to a corner at the +X-axis side and the +Z'-axis side on the surface at the −Y'-axis side of the framing portion 235. The other one of the extraction electrodes 232 is extracted from the excitation electrode 231 disposed on the surface at the −Y'-axis side of the vibrating portion 234 to the −X-axis side of the framing portion 235 via the connecting portion 236 at the −Z'-axis side, and extends to a corner at the −X-axis side and the −Z'-axis side on the surface at the −Y'-axis side of the framing portion 235.

The base plate 220 includes the bonding surface 122 disposed at a peripheral area of the surface at the +Y'-axis side of the base plate 220. The bonding surface 122 is to be bonded to the lid plate 110 via the sealing material 142 (see FIG. 9A). The base plate 220 also includes the depressed portion 121 at the center of the surface at the +Y'-axis side. The depressed portion 121 is depressed from the bonding surface 122 in the −Y'-axis direction. The base plate 220 includes external electrodes 224 disposed on the surface at the −Y'-axis side of the base plate 220, and castellations 126 disposed at the corners on the side faces of the base plate 220. The base plate 220 also includes connecting electrodes 223 formed at peripheral areas of the castellations 126 on the bonding surface 122 of the base plate 220. The connecting electrodes 223 are electrically connected to the external electrodes 224 via side surface electrodes 225 disposed at the castellations 126.

Figure 9A:
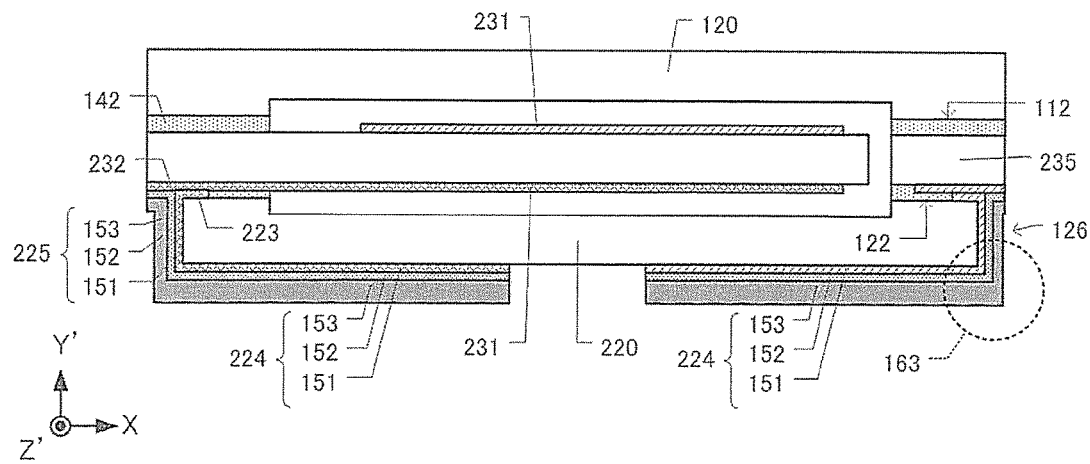
FIG. 9A is a cross-sectional view taken along the line IXA-IXA in FIG. 8.

FIG. 9A is a cross-sectional view taken along the line IXA-IXA in FIG. 8. In the quartz crystal device 200, the bonding surface 112 of the lid plate 110 is bonded to the surface at the +Y'-axis side of the framing portion 235 via the sealing material 142, and the bonding surface 122 of the base plate 220 is bonded to the surface at the −Y'-axis side of the framing portion 235 via the sealing material 142. Also, the extraction electrodes 232 are electrically connected to the connecting electrodes 223 when the quartz crystal vibrating piece 230 is bonded to the base plate 220. This electrically connects the excitation electrodes 231 to the external electrodes 224. The external electrode 224 includes the first metal film 151, a second metal film 152, and the electroless plating film 153. The first metal film 151 is disposed on the surface of the base material of the base plate 220, the second metal film 152 is disposed on the surface of the first metal film 151, and the electroless plating film 153 is disposed on the surface of the second metal film 152.

Figure 9B:
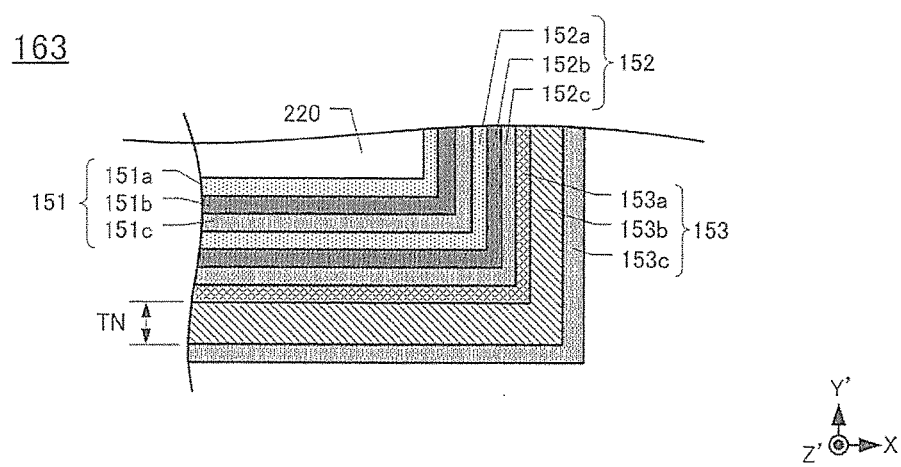
FIG. 9B is an enlarged view of a portion enclosed by a dotted line 163 in FIG. 9A.

FIG. 9B is an enlarged view of a portion enclosed by a dotted line 163 of FIG. 9A. FIG. 9B illustrates an enlarged cross-sectional view of the external electrode 224. The first metal film 151 is formed of three layers including the first layer 151a, the second layer 151b, and the third layer 151c. As illustrated in FIG. 2B, the first layer 151a is made of a chrome (Cr), the second layer 151b is made of a nickel-tungsten (Ni—W) or similar material, and the third layer 151c is made of a gold (Au).

The second metal film 152 includes a first layer 152a, a second layer 152b, and the third layer 153c. The first layer 152a is disposed on the surface of the first metal film 151, the second layer 152b is disposed on the surface of the first layer 152a, and a third layer 152c is disposed on the surface of the second layer 152b. The first layer 152a, the second layer 152b, and the third layer 152c respectively have the same configuration as those of the first layer 151a, the second layer 151b, and the third layer 151c of the first metal film 151. Namely, the second metal film 152 has the same configuration as that of the first metal film 151.

The electroless plating film 153 includes the first layer 153a, the second layer 153b, and the third layer 153c. The first layer 153a is disposed on the surface of the second metal film 152, and the second layer 153b is disposed on the surface of the first layer 153a, and the third layer 153c is disposed on the surface of the second layer 153b. The first layer 153a is made of a palladium (Pd). The second layer 153b is made of a nickel (Ni) and has the thickness TN, which is, for example, about 1 µm. In addition, the third layer 153c made of a gold (Au) is disposed on the surface of the second layer 153b in order to ensure a connection between the external electrodes 224 and a solder or similar material.

Method for Fabricating Quartz Crystal Device 200

Figure 10:
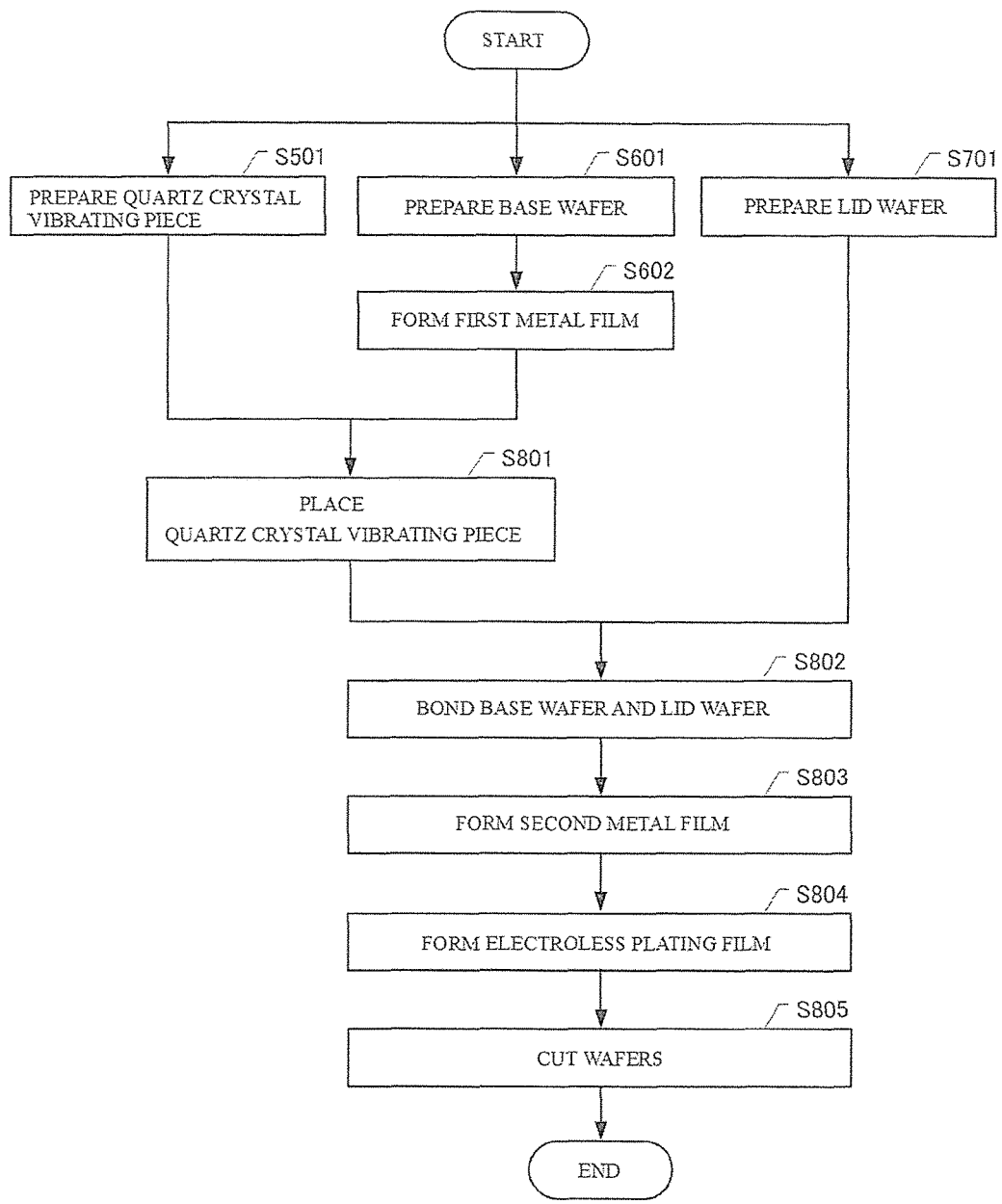
FIG. 10 is a flowchart illustrating a method for fabricating the quartz crystal device 200.

FIG. 10 is a flowchart illustrating a method for fabricating the quartz crystal device 200. The following describes the method for fabricating the quartz crystal device 200 with reference to the flowchart illustrated in FIG. 10.

In a step S501, a quartz-crystal wafer W230 is prepared. A plurality of quartz crystal vibrating pieces 230 has been formed on the quartz-crystal wafer W230. The step S501 is a process for preparing the quartz-crystal wafer.

Figure 11:
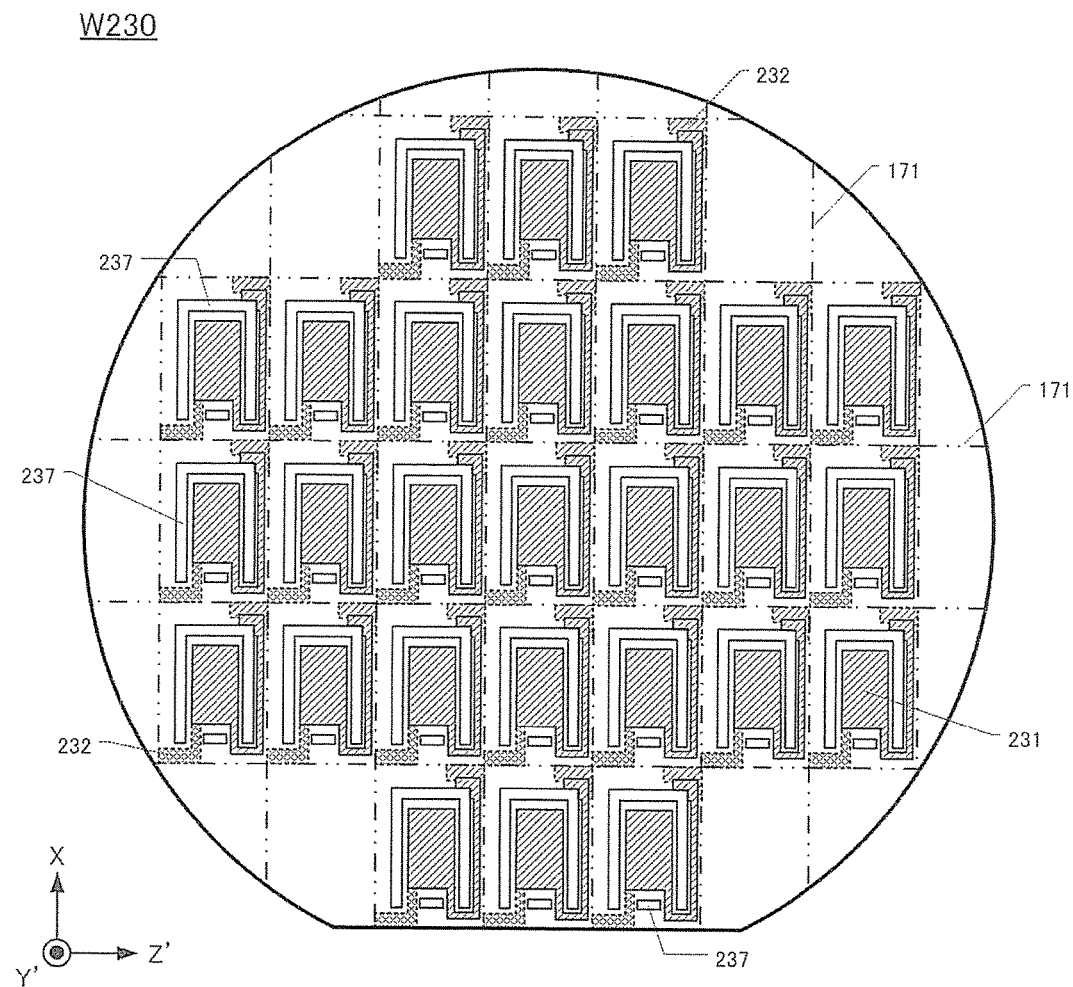
FIG. 11 is a plan view of a quartz-crystal wafer W230.

FIG. 11 is a plan view of the quartz-crystal wafer W230. A plurality of quartz crystal vibrating pieces 230 has been formed on the quartz-crystal wafer W230. FIG. 11 illustrates scribe lines 171 at boundaries between the quartz crystal vibrating pieces 230 adjacent to one another. The through grooves 237 are formed in the quartz-crystal wafer W230 by etching, and the excitation electrodes 231 and the extraction electrodes 232 are formed on the quartz-crystal wafer W230. This forms the plurality of quartz crystal vibrating pieces 230 on the quartz-crystal wafer W230.

In a step S601, a base wafer W220 is prepared. A plurality of base plates 220 is formed on the base wafer W220. The step S601 is a process for preparing the base wafer W220.

In a step S602, first metal films 151 are formed on the base wafer W220. As illustrated in FIG. 9A, the first metal film 151 forms the connecting electrode 223, and a part of the side surface electrode 225, and a part of the external electrode 224. Step S602 is a process for forming a metal film.

In a step S701, a lid wafer W110 is prepared. A plurality of lid plates 110 is formed on the lid wafer W110. The step S701 is a process for forming the lid wafer W110.

In a step S801, the quartz-crystal wafer W230 is placed on the base wafer W220. The step S801 is a process for placing the quartz-crystal wafer W230 on the base wafer W220. In the step S801, the quartz-crystal wafer W230 is bonded to the base wafer W220 such that the quartz crystal vibrating pieces 230 of the quartz-crystal wafer W230 are correspondingly placed on the surfaces at the +Y'-axis side of the respective base plates 220 of the base wafer W220. In this placement process, the bonding surface 122 of the base wafer W220 is bonded to the surface at the −Y'-axis side of the framing portion 235 disposed on the quartz-crystal wafer W230 via the sealing material 142.

In a step S802, the quartz-crystal wafer W230 is bonded to the lid wafer W110. The step S802 is a process for bonding. In the step S802, the lid wafer W110 is bonded to the surface at the +Y'-axis side of the quartz-crystal wafer W230 via the sealing material 142 such that the vibrating portion 234 of the quartz crystal vibrating piece 230 is confined in a sealed space.

Figure 12A:
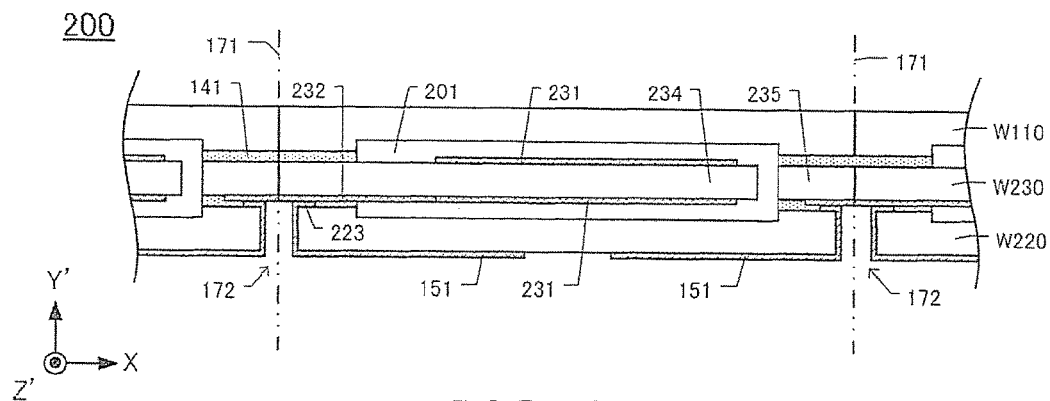
FIG. 12A is a partial cross-sectional view of the quartz-crystal wafer W230, the lid wafer W110, and the base wafer W220.

FIG. 12A is a partial cross-sectional view of the quartz-crystal wafer W230, the lid wafer W110, and the base wafer W220. FIG. 12A is a cross-sectional view including the IXA-IXA cross section of FIG. 8. The base wafer W220 is bonded to the surface at the −Y'-axis side of the framing portion 235 of the quartz-crystal wafer W230 via the sealing material 142. Also, the connecting electrode 223 is electrically connected to the extraction electrode 232. The lid wafer W110 is bonded to the surface at the +Y'-axis side of the framing portion 235 of the quartz-crystal wafer W230 via the sealing material 142. This forms cavities 201 between the wafers, and the vibrating portions 234 are confined in the sealed cavities 201.

In a step S803, the second metal films 152 are formed on the lid wafer W110 and the base wafer W220.

Figure 12B:
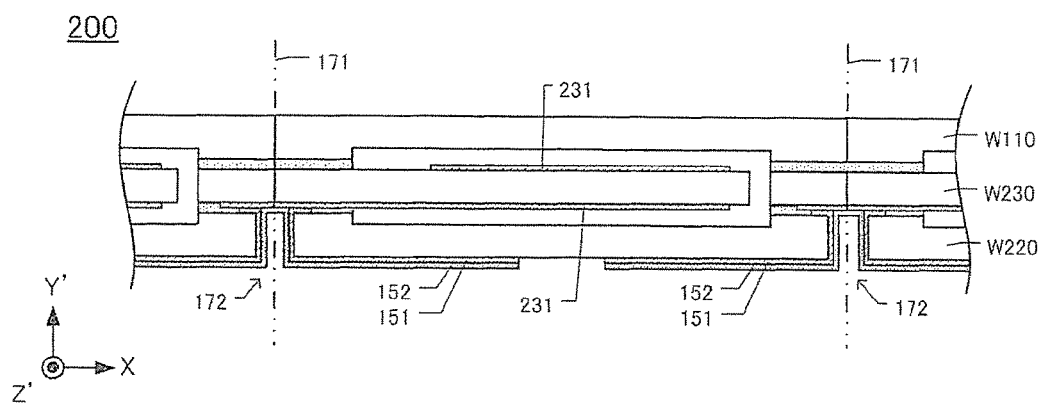
FIG. 12B is a partial cross-sectional view of the quartz-crystal wafer W230, the lid wafer W110, and the base wafer W220 with a second metal film 152 disposed on the base wafer W220.

FIG. 12B is a partial cross-sectional view of the quartz-crystal wafer W230, the lid wafer W110, and the base wafer W220 with the second metal film 152 disposed on the base wafer W220. As illustrated in FIG. 9B, the second metal film 152 is formed by forming a chrome (Cr) layer, a nickel-tungsten (Ni—W) layer, and a gold (Au) layer in this sequence from the −Y'-axis side of the base plate 220 by sputtering or vacuum evaporation.

In a step S804, the electroless plating films 153 are formed on the base wafer W220. The electroless plating films 153 are formed on the surface of the second metal films 152 that are formed on the base wafer W220 by electroless plating.

Figure 12C:
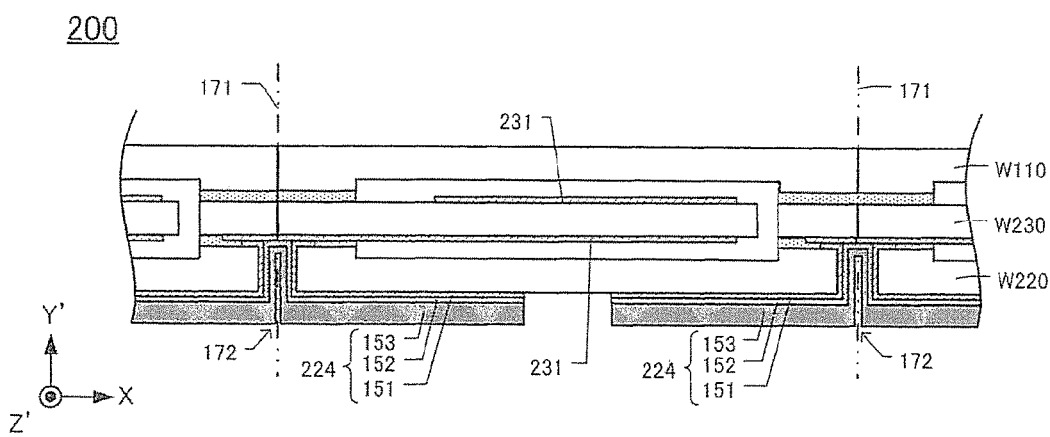
FIG. 12C is a partial cross-sectional view of the quartz-crystal wafer W230, the lid wafer W110, the base wafer W220 with the electroless plating film 153 disposed on the base wafer W220.

FIG. 12C is a partial cross-sectional view of the quartz-crystal wafer W230, the lid wafer W110, and the base wafer W220 with the electroless plating film 153 disposed on the base wafer W220. As illustrated in FIG. 9B, the electroless plating film 153 is formed of the first layer 153a, the second layer 153b, and the third layer 153c. In the step S804, the first layer 153a, the second layer 153b, and the third layer 153c are formed by respectively forming a palladium (Pd) layer, a nickel (Ni) layer, and a gold (Au) layer by electroless plating.

In a step S805, the base wafer W220, the lid wafer W110, and the quartz-crystal wafer W230 are diced along the scribe lines 171. This forms the individual quartz crystal devices 200.

Above all, although the preferred embodiments of this disclosure are described in detail, it is apparent to those skilled in the art that variations and modifications of the embodiments may be made within the technical scope of the disclosure.

For example, the quartz crystal device may include an oscillator so as to form a quartz crystal oscillator. In addition, the above-described embodiments disclose a case in which the quartz crystal vibrating piece is an AT-cut quartz-crystal vibrating piece. Also, a BT-cut quartz-crystal vibrating piece or similar vibrating piece is applicable, which similarly vibrates in the thickness-shear mode.

In addition, in the case of fabricating the quartz crystal device 100, the step S202 may further include forming another first metal film 151 on the surface of the first metal film 151 to form a plurality of metal films, or may further include, similarly to the quartz crystal device 200, forming the electroless plating film 153 before forming the second metal film 152. In the case of the quartz crystal device 200, the external electrode 224 and the side surface electrode 225 of the base plate 220 are formed of the first metal film 151, the second metal film 152, and the electroless plating film 153. Also, the external electrode 224 and the side surface electrode 225 of the base plate 220 may be formed of the first metal film 151 and the electroless plating film 153, not including the second metal film 152 similarly to the quartz crystal device 100.

In the quartz crystal device according to the first aspect of the disclosure, the quartz crystal device according to a second aspect may be configured as below. A content of the lead relative to a whole volume of the nickel layer has a value of 90 ppm to 470 ppm, and a content of the bismuth has a value of 5600 ppm to 7000 ppm.

In the quartz crystal device according to the first or the second aspect of the disclosure, the quartz crystal device according to a third aspect may be configured as below. The metal film includes at least a chromium layer formed on a surface of the base plate, a nickel-tungsten layer formed on a surface of the chromium layer, and a gold layer formed on a surface of the nickel-tungsten layer.

In the quartz crystal device according to anyone of the first to the third aspect of the disclosure, the quartz crystal device according to a fourth aspect may be configured as below. The electroless plating film includes a palladium layer formed on a surface of the metal film by electroless plating, a nickel layer formed on a surface of the palladium layer by electroless plating, a gold layer formed on a surface of the nickel layer by electroless plating.

A method for fabricating a surface mount type quartz crystal device according to a fifth aspect of the disclosure, the method includes: preparing a plurality of quartz crystal vibrating pieces; preparing a base wafer including a plurality of base plates each having a rectangular shape; preparing a lid wafer including a plurality of lid plates; forming a metal film by sputtering in a region where an external electrode is formed to mount the quartz crystal device on one principal surface of the base wafer; placing the plurality of quartz crystal vibrating pieces on the other principal surface of the base wafer; bonding the lid wafer to the other principal surface of the base wafer such that the quartz crystal pieces is sealed; and performing an electroless plating on the one principal surface of the base wafer to form an electroless plating film including a nickel layer on a surface of the metal film. The performing the electroless plating of the nickel layer includes impregnating the base wafer with a plating liquid including lead and bismuth. A content of the lead in the plating liquid has a value of 0.05 ml/L to 0.20 ml/L, a content of the bismuth in the plating liquid has a value of 3.00 ml/L.

A method for fabricating a quartz crystal device according to a sixth aspect of the disclosure, the method includes: preparing a quartz-crystal wafer including a plurality of quartz crystal vibrating pieces each including a vibrating portion configured to vibrate at a predetermined vibration frequency, a framing portion surrounding the vibrating portion, and a connecting portion connecting the vibrating portion and the framing portion; preparing a base wafer including a plurality of base plates each having a rectangular shape; preparing a lid wafer including a plurality of lid plates; forming a metal film by sputtering in a region where an external electrode is formed to mount the quartz crystal device on one principal surface of the base wafer; bonding the base wafer to the quartz-crystal wafer such that the plurality of quartz crystal vibrating pieces are respectively placed on the other principal surface of the base plates; bonding the lid wafer to the quartz-crystal wafer such that the vibrating portion is sealed; performing an electroless plating on the base wafer to form an electroless plating film including a nickel layer on a surface of the metal film. The performing the electroless plating of the nickel layer includes impregnating the base wafer with a plating liquid including lead and bismuth. A content of the lead in the plating liquid has a value of 0.05 ml/L to 0.20 ml/L. A content of the bismuth in the plating liquid has a value of 3.00 ml/L.

In the method for fabricating a quartz crystal device according to the fifth or the sixth aspect, the method according to a seventh aspect may be configured as below. The metal film includes at least a chromium film formed on a surface of the base wafer, a nickel-tungsten film formed on a surface of the chromium film, and a gold film formed on a surface of the nickel-tungsten film.

In the method for fabricating a quartz crystal device according to any one of the fifth to the seventh aspect, the method according to an eighth aspect may be configured as below. The performing the electroless plating includes: forming a palladium layer by electroless plating before forming the nickel layer, and forming a gold layer on a surface of the nickel layer by electroless plating.

The quartz crystal device and the method for fabricating the quartz crystal device according to the disclosure are able to reduce the lead content in the external electrodes while keeping the drop-resistance and the bend-resistance.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A quartz crystal device which is in surface mount type, and the quartz crystal device comprising:
   a quartz crystal vibrating piece, configured to vibrate at a predetermined frequency; and
   a base plate made of a crystal or a glass, the base plate including an external electrode disposed on a bottom surface of the base plate to mount the quartz crystal device, the quartz crystal vibrating piece being placed on an opposite surface of the bottom face, wherein
   the external electrode includes a metal film formed on a surface of the base plate by sputtering, and an electroless plating film formed on a surface of the metal film by electroless plating, and
   the electroless plating film includes a nickel layer, and the nickel layer including lead and bismuth.

2. The quartz crystal device according to claim 1, wherein
a content of the lead relative to a whole volume of the nickel layer has a value of 90 ppm to 470 ppm, and
a content of the bismuth has a value of 5600 ppm to 7000 ppm.

3. The quartz crystal device according to claim 1, wherein the metal film includes at least a chromium layer formed on a surface of the base plate, a nickel-tungsten layer foimed on a surface of the chromium layer, and a gold layer formed on a surface of the nickel-tungsten layer.

4. The quartz crystal device according to claim 1, wherein the electroless plating film includes a palladium layer foamed on a surface of the metal film by electroless plating, a nickel layer formed on a surface of the palladium layer by electroless plating, a gold layer formed on a surface of the nickel layer by electroless plating.

5. A method for fabricating the quartz crystal device which is in surface mount type according to claim 1, and the method comprising:
preparing a plurality of quartz crystal vibrating pieces;
preparing a base wafer including a plurality of base plates each having a rectangular shape;
preparing a lid wafer including a plurality of lid plates;
forming a metal film by sputtering in a region where an external electrode is formed to mount the quartz crystal device on one principal surface of the base wafer;
placing the plurality of quartz crystal vibrating pieces on the other principal surface of the base wafer;
bonding the lid wafer to the other principal surface of the base wafer such that the quartz crystal pieces is sealed; and
performing an electroless plating on the one principal surface of the base wafer to form an electroless plating film including a nickel layer on a surface of the metal film, wherein
the performing of the electroless plating of the nickel layer includes impregnating the base wafer with a plating liquid including lead and bismuth, and
a content of the lead in the plating liquid has a value of 0.05 ml/L to 0.20 ml/L, and
a content of the bismuth in the plating liquid has a value of 3.00 ml/L.

6. A method for fabricating the quartz crystal device which is in surface mount type according to claim 1, and the method comprising:
preparing a quartz-crystal wafer including a plurality of quartz crystal vibrating pieces, each quartz crystal vibrating piece including a vibrating portion configured to vibrate at a predetermined vibration frequency, a framing portion surrounding the vibrating portion, and a connecting portion connecting the vibrating portion and the framing portion;
preparing a base wafer including a plurality of base plates, each base plate having a rectangular shape;
preparing a lid wafer including a plurality of lid plates;
forming a metal film by sputtering in a region where an external electrode is formed to mount the quartz crystal device on one principal surface of the base wafer;
bonding the base wafer to the quartz-crystal wafer such that the plurality of quartz crystal vibrating pieces are respectively placed on the other principal surfaces of the base plates;
bonding the lid wafer to the quartz-crystal wafer such that the vibrating portion is sealed;
performing an electroless plating on the base wafer to form an electroless plating film including a nickel layer on a surface of the metal film, wherein
the performing of the electroless plating of the nickel layer includes impregnating the base wafer with a plating liquid including lead and bismuth, and
a content of the lead in the plating liquid has a value of 0.05 ml/L to 0.20 ml/L, and
a content of the bismuth in the plating liquid has a value of 3.00 ml/L.

7. The method for fabricating the quartz crystal device according to claim 5, wherein
the metal film includes at least a chromium film formed on a surface of the base wafer, a nickel-tungsten film formed on a surface of the chromium film, and a gold film formed on a surface of the nickel-tungsten film.

8. The method for fabricating the quartz crystal device according to claim 5, wherein
the performing of the electroless plating includes:
forming a palladium layer by electroless plating before forming the nickel layer, and
forming a gold layer on a surface of the nickel layer by electroless plating.

* * * * *